United States Patent
Yamaguchi

(10) Patent No.: US 7,414,256 B2
(45) Date of Patent: Aug. 19, 2008

(54) IMAGE DETECTION AND READOUT APPARATUS HAVING MULTIPLE READOUT REGIONS

(75) Inventor: Akira Yamaguchi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 35 days.

(21) Appl. No.: 11/366,550

(22) Filed: Mar. 3, 2006

(65) Prior Publication Data
US 2006/0197009 A1 Sep. 7, 2006

(30) Foreign Application Priority Data
Mar. 3, 2005 (JP) .............................. 2005-058846

(51) Int. Cl.
*G01T 1/24* (2006.01)
(52) U.S. Cl. ...................... 250/591; 250/580
(58) Field of Classification Search ................. 250/591, 250/580, 370.08, 370.09
See application file for complete search history.

(56) References Cited

U.S. PATENT DOCUMENTS 6,268,614 B1 7/2001 Imai
6,376,857 B1 * 4/2002 Imai ........................... 250/591
6,614,045 B2 * 9/2003 Shoji .......................... 250/591
6,770,901 B1 8/2004 Ogawa et al.
2004/0227114 A1 * 11/2004 Imai ........................... 250/591

\* cited by examiner

*Primary Examiner*—Georgia Y. Epps
*Assistant Examiner*—Tony Ko
(74) *Attorney, Agent, or Firm*—Sughrue Mion, PLLC

(57) ABSTRACT

An image detection and readout apparatus constituted by a solid state detector constructed to generate electrical currents according to the electrostatic latent image when scanned by readout light, a surface light source for scanning the solid state radiation detector by the readout light, and a light source control means for controlling the surface light source. The stripe electrode of the solid state detector is divided into two sections at the center in the length direction of the elements of the stripe electrode to form two readout regions in order to reduce the capacitance component between the adjacent elements, as well as the resistance component of the elements. In addition, the light source control means is configured to control the surface light source to cause the scanning to be performed by the surface light source in parallel simultaneously for the readout regions.

5 Claims, 2 Drawing Sheets

IMAGE DETECTION AND READOUT APPARATUS HAVING MULTIPLE READOUT REGIONS

BACKGROUND OF THE INVENTION

1. Field of the Invention

The present invention relates to an image detection and readout apparatus that includes a solid state detector constructed to record an image as an electrostatic latent image, and to generate electrical currents according to the electrostatic latent image when scanned by readout light, a surface light source constituted by multitudes of linear light sources arranged in parallel, each for emitting readout light, and a light source control means configured to sequentially switch and drive the linear light sources to cause the scanning to be performed by the linear light sources.

2. Description of the Related Art

Today, various types of radiation image recording/readout systems that use a solid state radiation detector (hereinafter also referred to as simply "detector") are proposed in the field of radiation imaging for medical diagnosis and the like. The solid state radiation detector described above temporarily stores electric charges in the charge storage section as latent image charges obtained by detecting radiation and outputs electrical signals representing the radiation image information by converting the latent image charges. Various types of detectors are proposed as the solid state radiation detector for use in such systems. From the aspect of charge reading out process in which charges stored in the detector are read out, some of the detectors are categorized into the optical readout type in which the charges are read out by irradiating readout light (readout electromagnetic wave) on the detector.

The inventor of the present invention has proposed a detector having a fast readout response along with an efficient signal charge readout capability as one of the optical readout type solid state radiation detector as described in U.S. Pat. Nos. 6,268,614 and 6,770,901. The detector has a set of layers layered in the order of: a first conductive layer having transparency to recording radiation or light excited by the recording radiation (hereinafter referred to as "recording light"); a recording photoconductive layer that shows conductivity when exposed to the recording light; a charge transport layer that acts as substantially an insulator against charges of the same polarity as the charges charged on the first conductive layer and as substantially a conductor for the charges of the opposite polarity; a readout photoconductive layer that shows conductivity when exposed to readout light; a second conductive layer having transparency to the readout light. The layer composite has a charge storage section formed between the recording photoconductive layer and charge transport layer for storing latent image charges (electrostatic latent image) representing image information.

In particular, the solid state radiation detector proposed by the inventor of the present invention as described in U.S. Pat. No. 6,770,901 uses a stripe electrode constituted by multitudes of charge detecting linear electrodes having transparency to readout light as the electrode of the second conductive layer having transparency to readout light. In addition, multitudes of auxiliary electrodes for outputting electrical signals corresponding to the amount of latent image charges stored in the charge storage section are provided in the second conductive layer alternately and in parallel with the charge detecting linear electrodes.

By providing the sub-stripe electrode constituted by the multitudes of auxiliary linear electrodes in the second conductive layer, a capacitor is newly formed between the charge storage section and the sub-stripe electrode. This allows the transport charges of the opposite polarity to that of the latent image charges stored in the charge storage section by the recording light to be charged also on the sub-stripe electrode by the rearrangement of charges in the charge reading out process. This may reduce the amount of transport charges to be allocated to the capacitor formed between the stripe electrode and charge storage section with the readout photoconductive layer being sandwiched between them to relatively small compared with the case where no such sub-stripe electrode is provided. Consequently, the amount of signal charges which may be read out from the detector to outside is increased and the readout efficiency is improved, resulting in a fast readout response with an efficient signal charge extraction capability.

Further, an image detection and readout system that includes a solid state detector of the type described above, a surface light source constituted by multitudes of linear light sources arranged in parallel, each for emitting readout light, and a light source control means configured to sequentially switch and drive the linear light sources to cause the scanning to be performed by the linear light sources is proposed as described, for example, in U.S. Pat. No. 6,376,857.

In the mean time, an electrode of several tens of centimeters long with several tens of micrometers wide is envisages to be used as the linear electrodes constituting the stripe electrode of the solid state detector described above. The stripe electrode constituted by such long and narrow linear electrodes has a large resistance component which degrade S/N ratio of the image signals read out from the solid state detector. Further, such stripe electrode has a large capacitance component due to the spacing as narrow as several tens of micrometers between the adjacent linear electrodes. This also degrades S/N ratio of the image signals read out from the solid state detector.

In the embodiment disclosed in the U.S. Pat. No. 6,376,857, when obtaining image signals from such solid state detector, the image signals are obtained from the solid state detector by sequentially driving a plurality of linear light sources extending in the direction orthogonal to the length direction of the linear electrodes and scanning the solid state detector by the readout light emitted from each of the linear light sources. As described above, each of the linear electrodes is as long as several tens of centimeters. This brings about a problem that it takes a long time to scan over the entire length of the linear electrodes by sequentially driving the linear light sources.

The present invention has been developed in view of the circumstances described above. It is an object of the present invention to provide an image detection and readout apparatus capable of improving S/N ratio of detected signals and enhancing image signal acquisition speed. The apparatus includes a solid state detector constructed to record an image as an electrostatic latent image, and to generate electrical currents according to the electrostatic latent image when scanned by readout light; a surface light source constituted by multitudes of linear light sources arranged in parallel, each for emitting readout light; and a light source control means configured to sequentially switch and drive the linear light sources to cause the scanning to be performed by the linear light sources.

SUMMARY OF THE INVENTION

The image detection and readout apparatus of the present invention is an apparatus comprising:

a solid state detector constructed to record an image as an electrostatic latent image, and to generate electrical currents according to the electrostatic latent image when scanned by readout light;

current detecting means for detecting the electrical currents generated by the solid state detector;

a surface light source constituted by multitudes of linear light sources arranged in parallel, each for emitting readout light; and a light source control means configured to sequentially switch and drive the linear light sources to cause the scanning to be performed by the linear light sources, wherein:

the solid state detector includes a stripe electrode constituted by multitudes of linear electrodes arranged in parallel for outputting electrical currents according to the electrostatic latent image;

the linear light sources are arranged to extend in the direction orthogonal to the length direction of the linear electrodes;

the stripe electrode is divided into a plurality of sections in the length direction of the linear electrodes to form a plurality of readout regions;

different readout regions of the plurality of readout regions are connected to different groups of the current detecting means; and the light source control means is configured to control the linear light sources to cause the scanning to be performed by the linear light sources in parallel simultaneously for the plurality of readout regions of the stripe electrode.

The referent of "solid state detector" as used herein means a detector constructed to detect radiation representing image information of a subject, and to output image signals representing the radiation image of the subject. The detector converts radiation incident thereon to electric charges directly or after converting the radiation to light, and outputs the electric charges to outside. In this way, image signals representing the radiation image of the subject is obtained.

Various types of solid state detectors are available. For example, from the aspect of charge generating process in which radiation is converted to electric charges, the optical conversion type in which fluorescence emitted from a phosphor when exposed to radiation is detected by the photoconductive layer, and signal charges obtained thereby is tentatively stored in the charge storage section, which is then converted to image signals (electrical signals) before being outputted, a direct conversion type in which signal charges generated in the photoconductive layer when exposed to radiation are collected by the charge collecting electrodes and tentatively stored in the charge storage section, which is then converted to electrical signals before being outputted, and the like are available. From the aspect of charge reading out process in which stored electric charges are read out to outside, the optical readout type in which the stored electric charges are read out by irradiating readout light (readout electromagnetic wave) on the detector, and the like are available. Further, an improved direct conversion type that combines the direct conversion type and optical conversion type is proposed by the inventor of the present invention as described in U.S. Pat. No. 6,770,901.

The referent of "cause the scanning to be performed in parallel simultaneously" as used herein is not limited to the case where the scanning is performed in parallel simultaneously for all of the readout regions, but may include, for example, the case where the scanning is performed in parallel simultaneously for two or more readout regions when the stripe electrode is divided into three or more readout regions.

The image detection and readout apparatus of the present invention includes a solid state detector constructed to record an image as an electrostatic latent image, and to generate electrical currents according to the electrostatic latent image when scanned by readout light; current detecting means for detecting the electrical currents generated by the solid state detector; a surface light source constituted by multitudes of linear light sources arranged in parallel, each for emitting readout light; and a light source control means configured to sequentially switch and drive the linear light sources to cause the scanning to be performed by the linear light surfaces. The solid state detector includes a stripe electrode constituted by multitudes of linear electrodes arranged in parallel for outputting electrical currents according to the electrostatic latent image, and the linear light sources are arranged to extend in the direction orthogonal to the length direction of the linear electrodes. Furthermore, the stripe electrode is divided into a plurality of sections in the length direction of the linear electrodes to form a plurality of readout regions, so that the length of the linear electrodes becomes relatively short compared with the case where no such division is made to the stripe electrode. This may reduce the capacitance component between adjacent linear electrodes, as well as the resistance component of the linear electrodes. Consequently, S/N ratio of the image signals read out from the solid state detector may be improved. Further, the light source control means is configure to control the linear light sources to cause the scanning to be performed in parallel simultaneously for a plurality of readout regions of the stripe electrode. This may enhance the image signal acquisition speed.

DESCRIPTION OF THE PREFERRED EMBODIMENTS

Figure 1A:
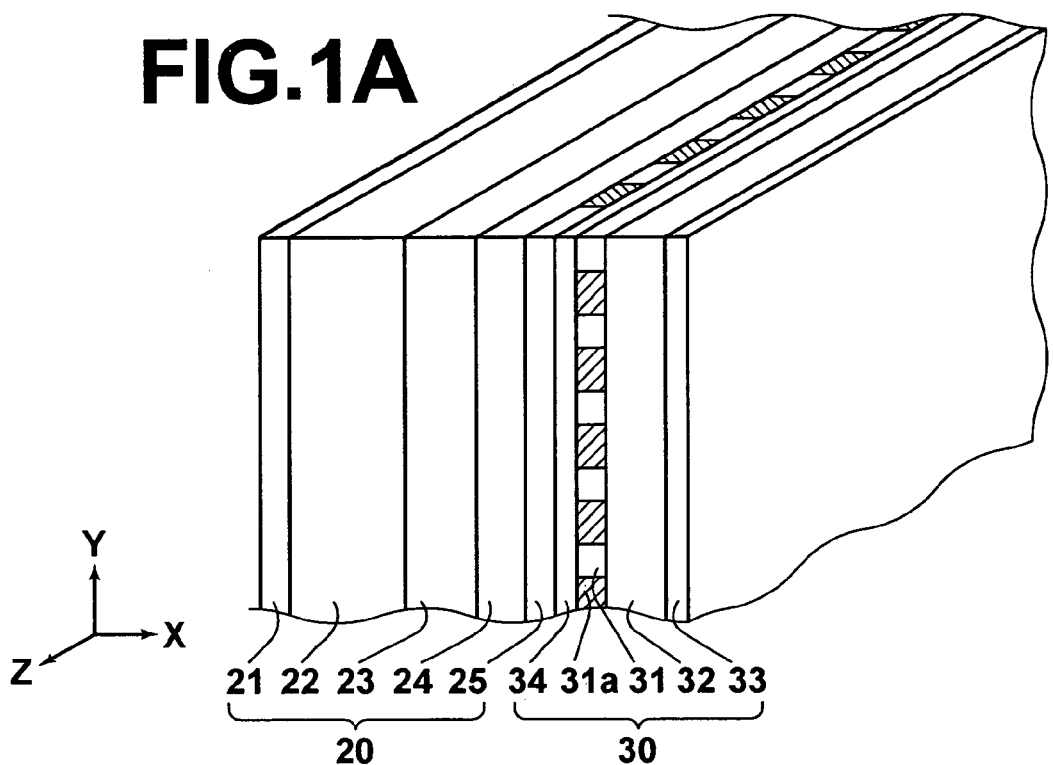
FIG. 1A is a perspective view of the solid state radiation detector and surface light source used in the image detection and readout apparatus according to an embodiment of the present invention.
Figure 1B:
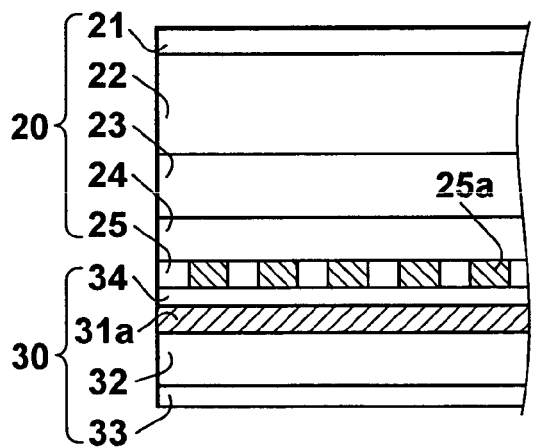
FIG. 1B is a cross-sectional view of the solid state radiation detector and surface light source used in the image detection and readout apparatus according to an embodiment of the present invention.
Figure 1C:
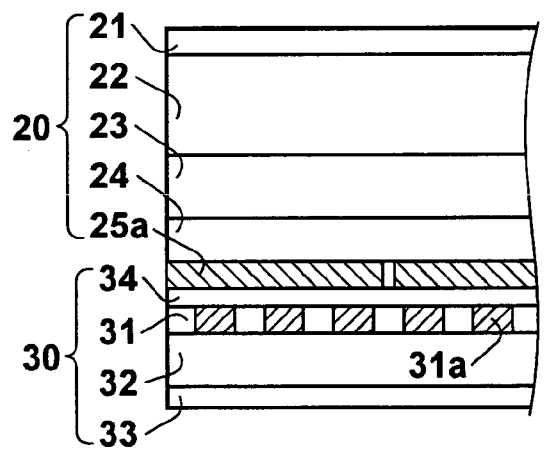
FIG. 1C is a cross-sectional view of the solid state radiation detector and surface light source used in the image detection and readout apparatus according to an embodiment of the present invention.
Figure 2:
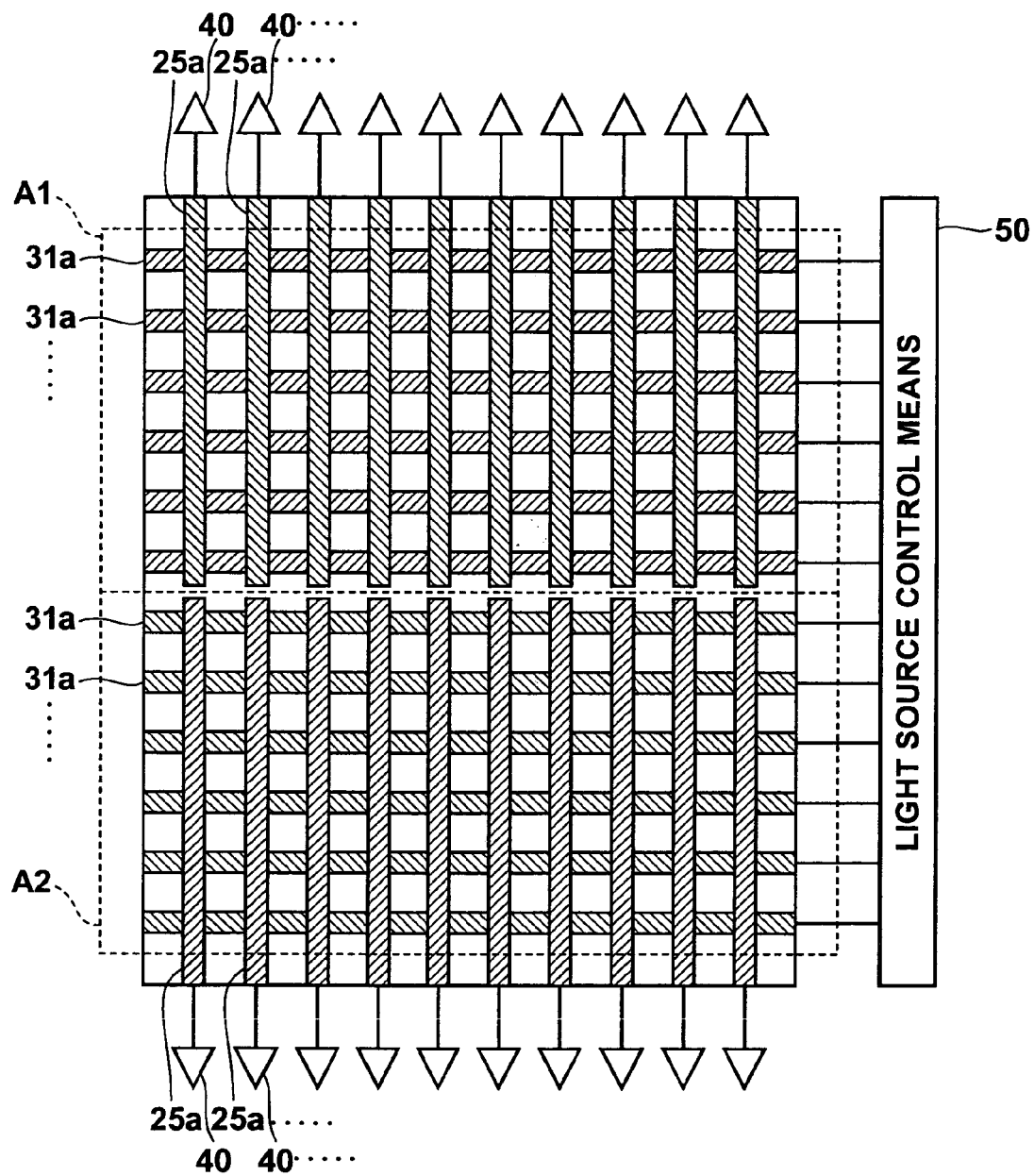
FIG. 2 is a schematic configuration diagram of the image detection and readout apparatus described above.

Hereinafter, an embodiment of the present invention will be described with reference to accompanying drawings. FIG. 1A is a perspective view of the solid state detector and surface light source used in the image detection and readout apparatus according to an embodiment of the present invention. FIG. 1B is an X-Z cross-sectional view of the solid state radiation detector and surface light source shown in FIG. 1A, and FIG. 1C is an X-Y cross-sectional vie thereof. FIG. 2 is a schematic configuration diagram of the image detection and readout apparatus described above. In FIG. 2, only the linear electrodes of the solid state radiation detector and the linear light sources of the surface light source are illustrated.

The image detection and readout apparatus includes a solid state radiation detector 20 constructed to generate electrical currents according to the electrostatic latent image when scanned by readout light; a surface light source 30 for scanning the solid state radiation detector 20 by readout light; current detecting means 40 for detecting electrical currents outputted from the solid state radiation detector 20; and a light source control means 50 for controlling the surface light source 30.

The solid state radiation detector 20 and surface light source 30 are provided on a glass substrate (not shown) as layers.

The solid state radiation detector 20 is constructed to record radiation image information as an electrostatic latent image, and to generate electrical currents according to the electrostatic latent image when scanned by a readout electromagnetic wave (readout light). It has a set of layers layered in the order of: a first conductive layer 21 having transparency to recording radiation (recording light), such as X-rays transmitted through a subject; a recording photoconductive layer 22 that generates charges and shows conductivity when exposed to the recording light; a charge transport layer 23 that acts as substantially an insulator against the charges of the polarity of latent image charges (e.g. negative charges) and as substantially a conductor for the charges of the transport polarity (positive charges in this case) which is opposite to the polarity of the latent image charges; a readout photoconductive layer 24 that generates charges and shows conductivity when exposed to readout light; and a second conductive layer 25 having transparency to the readout light. A charge storage section is formed at the interface between the recording photoconductive layer 22 and charge transport layer 23.

The first conductive layer 21 and second conductive layer 25 constitute electrodes respectively. The electrode of the first conductive layer 21 is a flat-plate electrode extending two-dimensionally. On the other hand, the electrode of the second conductive layer 25 is a stripe electrode constituted by multitudes of elements 25a (linear electrodes), which are illustrated by slashed lines in the drawings, arranged in stripes at a pixel pitch (refer to electrostatic recording body as described, for example, in U.S. Pat. No. 6,268,614). As shown in FIG. 2, the stripe electrode of the second conductive layer 25 is divided into two sections at the center of the length direction of the elements 25a to form two readout regions A1 and A2. Each of the elements 25a is connected to each of the corresponding current detecting means 40 at the ends of the solid state radiation image detector 20. Here, the arrangement direction of the elements 25a corresponds to the main scanning direction, and the length direction of the elements 25a corresponds to the subscanning direction.

As for the material of the readout photoconductive layer 24, photoconductive materials having high sensitivities to electromagnetic waves with wavelengths in the range from near-ultraviolet to blue region (300 to 550 nm), and low sensitivities to electromagnetic waves with wavelengths of red region (greater than or equal to 700 nm) are preferably used. More specifically, photoconductive materials consisting primarily of at least one of the materials selected from the group of a-Se, PbI2, Bi12 (Ge, Si)O20, perylenebisimide (R=n-propyl), and perylenebisimide (R=n-neopentyl) are preferable. In the present embodiment, a-Se is used.

The surface light source 30 is an EL body having a conductive layer 31, an EL layer 32, and a conductive layer 33. An insulation layer 34 is provided between the second conductive layer 25 of the solid state radiation detector 20 and the conductive layer 31. The conductive layer 31 is constituted by a stripe electrode having multitudes of elements (linear electrodes) 31a arranged in stripes at a pixel pitch such that the elements 31a intersect (substantially at right angle in the present embodiment) with the elements 25a of the solid state radiation detector 20. In this way, multitudes of linear light sources arranged two-dimensionally are provided through the elements 31a (slashed portions in the drawings). Each of the elements 31a is connected to the light source control means 50. Further, each of the elements 31a is made of a material having transparency to EL light emitted from the EL layer 32. The conductive layer 33 is constituted by a flat-plate electrode made of a material that totally reflects EL light emitted from the EL layer 32.

As described above, the readout photoconductive layer 24 has a high sensitivity to electromagnetic waves with wavelengths in the range from near-ultraviolet to blue region (300 to 550 nm), and a low sensitivity to electromagnetic waves with wavelengths of red region (greater than or equal to 700 nm). Therefore, a surface light source that emits light with a wavelength in the range from near-ultraviolet to blue region, which is less than or equal to 550 nm, is used as the surface light source 30 (EL body).

The light source control means 50 is configured to cause a predetermined voltage to be applied between the elements 31a and conductive layer 33 facing the elements 31a on an individual element 31a basis or simultaneously for a plurality of or all of the elements 31a. The predetermined DC voltage is applied to each of the elements 31a by switching the elements 31a, and EL light is emitted from the portion of the EL layer sandwiched by the element 31a to which the DC voltage is applied and the conductive layer 33. The element 31a is a linear element so that the EL light transmitted through the element 31a may be used as linear readout light. That is, the surface light source 30 is equivalent to the light source constituted by linear microscopic light sources arranged two-dimensionally, and the solid state radiation detector 20 is scanned by the readout light by sequentially switching the elements 31 and generating EL light.

In the image detection and readout apparatus according to the present embodiment, the stripe electrode of the solid state radiation detector 20 is divided into two sections at the center of the length direction of the elements 25a to form two readout regions A1 and A2. Consequently, a more rapid image signal acquisition speed may be obtained by configuring the light source control means 50 to control the surface light source 30 to cause the scanning to be performed in parallel simultaneously for the readout regions A1 and A2 by switching the elements 31a corresponding to respective readout regions A1 and A2 simultaneously and sequentially to provide EL light when scanning by the readout light for the detector 20 is performed.

Further, the division of the stripe electrode of the solid state radiation detector 20 into two sections at the center of the length direction of the elements 25a may result in the length of the elements 25a to become relatively short compared with the case where the stripe electrode is not divided. This may reduce the capacitance component between adjacent elements 25a, as well as the resistance component of the elements 25a. Consequently, S/N ratio of the image signals readout from the solid state radiation detector 20 may be improved.

So far a preferred embodiment of the present invention has been described, but it will be appreciated that the present invention should not be construed as limited to the embodiment described above. For example, the stripe electrode of the solid state radiation detector 20 may be divided into three or more readout regions.

Further, the solid state radiation detector of the present invention may further includes a sub-stripe electrode for improving readout efficiency within the second conductive layer as described, for example, in U.S. Pat. No. 6,770,901. In this case, the sub-stripe electrode is also required to be divided in the same manner as in the stripe electrode.

What is claimed is:

1. An image detection and readout apparatus, comprising:
a solid state detector constructed to record an image as an electrostatic latent image, and to generate electrical currents according to the electrostatic latent image when scanned by readout light;
current detecting means for detecting the electrical currents generated by the solid state detector;
a surface light source constituted by multitudes of linear light sources arranged in parallel, each for emitting readout light; and
a light source control means configured to sequentially switch and drive the linear light sources to cause the scanning to be performed by the linear light sources, wherein:
the solid state detector includes a stripe electrode constituted by multitudes of linear electrodes arranged in parallel for outputting electrical currents according to the electrostatic latent image;
the linear light sources are arranged to extend in the direction orthogonal to the length direction of the linear electrodes;
the stripe electrode is divided into a plurality of sections in the length direction of the linear electrodes to form a plurality of readout regions;
different readout regions of the plurality of readout regions are connected to different groups of the current detecting means; and
the light source control means is configured to control the linear light sources to cause the scanning to be performed by the linear light sources in parallel simultaneously for the plurality of readout regions of the stripe electrode.

2. The image detection and readout apparatus according to claim 1, wherein the stripe electrode is divided into two sections in the length direction of the linear electrodes to form two readout regions.

3. The image detection and readout apparatus according to claim 1, wherein the light sources are divided into groups, each group performing the scanning for a corresponding readout region of the plurality of readout regions.

4. The image detection and readout apparatus according to claim 1, wherein a number of the groups is equal to a number of the plurality of readout regions.

5. The image detection and readout apparatus according to claim 1, wherein the scanning to be performed is for reading out data from the plurality of readout regions of the stripe electrode.

* * * * *